(12) United States Patent
Montalvo

(10) Patent No.: US 6,188,282 B1
(45) Date of Patent: Feb. 13, 2001

(54) DIFFERENTIAL AMPLIFIER WITH REDUCED EVEN ORDER NON-LINEARITY AND ASSOCIATED METHODS

(75) Inventor: Antonio Montalvo, Raleigh, NC (US)

(73) Assignee: Ericsson Inc., Research Triangle Park, NC (US)

(*) Notice: Under 35 U.S.C. 154(b), the term of this patent shall be extended for 0 days.

(21) Appl. No.: 09/415,544

(22) Filed: Oct. 8, 1999

(51) Int. Cl.[7] .................................................. H03F 3/45
(52) U.S. Cl. ......................... 330/260; 330/252; 327/307
(58) Field of Search ................................ 330/252, 260; 327/307

(56) References Cited

U.S. PATENT DOCUMENTS

| | | | |
|---|---|---|---|
| 2,852,625 | * 9/1958 | Nuut | 179/171 |
| 3,213,385 | * 10/1965 | Sikorra | 330/51 |
| 3,509,460 | * 4/1970 | Mizrahi | 324/111 |
| 4,396,891 | * 8/1983 | Johansson et al. | 330/254 |
| 5,331,478 | * 7/1994 | Aranovsky | 360/67 |
| 5,422,889 | 6/1995 | Sevenhans et al. . | |
| 5,471,665 | 11/1995 | Pace et al. . | |
| 5,596,299 | * 1/1997 | Persico et al. | 330/260 |

* cited by examiner

Primary Examiner—Benny Lee
Assistant Examiner—Henry Choe
(74) Attorney, Agent, or Firm—Myers Bigel Sibley & Sajovec

(57) ABSTRACT

A differential amplifier having reduced even-order non-linearity is provided that comprises a differential amplifier and an analog voltage compensation circuit that is coupled to one of the input ports to the differential amplifier so as to provide an analog compensation voltage to that input port so as to reduce the imbalance in the differential amplifier. In a preferred embodiment of the present invention, the analog voltage compensation circuit comprises a transconductance amplifier that is coupled between the output of the differential amplifier and one of the inputs of the differential amplifier which may be used to sense the effect of the imbalance on the output of the differential amplifier, and a direct current voltage source coupled to each of the inputs to the differential amplifier.

23 Claims, 5 Drawing Sheets

DIFFERENTIAL AMPLIFIER WITH REDUCED EVEN ORDER NON-LINEARITY AND ASSOCIATED METHODS

FIELD OF THE INVENTION

The present invention relates to amplifiers and, more particularly, to amplifiers suitable for use in wireless telephone applications.

BACKGROUND OF THE INVENTION

A difference or "differential" amplifier refers to an amplifier that produces an output that is proportional to the difference between two inputs (such as two input voltages or two input currents), and produces no output when the two input signals are equal. As is well known to those of skill in the art, differential amplifiers may be implemented using either bipolar junction transistors ("BJT"), field effect transistors ("FET") or other active device technologies. A typical BJT-based differential voltage amplifier comprises a pair of BJT transistors that are coupled at their emitters and biased by a current source that is connected to the coupled emitters. An input signal is applied to the base of each transistor, and the amplifier's output is the voltage measured between the collectors of the two transistors. FET-based differential voltage amplifiers are typically configured similarly, with the current source coupled to the sources of the transistors, and the input signals applied to the gates of the transistors. Those of skill in the art will appreciate that there are a wide variety of different types of differential amplifiers, including voltage, current, transconductance and transresistance amplifiers, and that each type of differential amplifier may be implemented in a wide variety of configurations.

Differential amplifiers are used in a wide variety of electronics applications, such as in stereos, radio receivers, telephones and the like. In many of these applications, it is desirable that the response of the amplifier be as linear as possible. An amplifier provides a "linear response" if the output of the amplifier is an exact replica of the input, except that it has a different magnitude (i.e., there has been no change in the input signal except for in its magnitude). One reason that a highly linear response may be required is because when two or more signals are input to a non-linear device, intermodulation (IM) power is created. These intermodulation effects may appear as interference to the desired signal. As is well known to those of skill in the art, intermodulation products appear at the frequencies corresponding to the different combinations of sums and differences of the frequencies of the signals input to the non-linear device. Thus, for instance, where two signals are input to the non-linear device, the center frequencies of the resulting IM product may be computed as:

$$\text{Frequencies IM}_{m,n} = \text{ABS}[m(f_1) \pm n(f_2)] \quad (1)$$

where m and n are integers, and $f_1$ and $f_2$ are the center frequencies of the respective input signals. The "order" of the intermodulation product centered at a particular frequency is the sum of m and n. Thus, in the case where two input signals, centered at 600 MHz signal and 1800 MHz respectively, are input into a nonlinear device, the second order intermodulation product will appear at 1200 MHz and 2400 MHz, and the third order intermodulation product will appear at 600 MHz, 3000 MHz and 4200 MHz, and so forth.

In communication systems that employ some type of frequency division multiple access ("FDMA") protocol, the user terminals may be configured so as to be capable of transmitting and receiving signals at a variety of different frequencies. Consequently, the amplifiers used in these systems may be designed to amplify signals across the entire bandwidth of the FMDA system, even though the desired signal may be of much narrower bandwidth. As a result, signals transmitted to other users in other channels of the FDMA communications system may be received by a user terminal, and amplified by various amplifiers included in the receiver. In these and a variety of other applications in which multiple signals are simultaneously input into an amplifier, it will typically be desirable to use an amplifier that provides as linear a response as possible, as any non-linearity will give rise to intermodulation distortion with its interference effects.

In certain radio receiver topologies, such as in homodyne receivers, the receiver operates on signals that are at or near baseband. In these systems, even-order non-linearity (i.e., intermodulation which has an "order", as defined above, which is an even number) may be especially troubling, because it typically creates interference at or near baseband. Balanced, or differential, circuits are typically used in such applications, as they may have reduced even-order non-linearity as compared to an equivalent single-ended circuit, as the even-order non-linearities theoretically are cancelled out. While it typically is difficult to achieve a perfect balance, it is often possible to significantly reduce the level of the evenorder non-linearities by using differential circuits.

In practice, the degree of balance of a differential circuit is largely determined by how well the components comprising the circuit are "matched." Thus, for example, to obtain a high degree of balance in a differential amplifier one should construct the amplifier using two transistors that have substantially identical electrical properties and performance. However, due to limitations in semiconductor fabrication techniques, it becomes increasingly difficult to fabricate transistors with identical electrical properties as the physical size of the transistors decreases. Consequently, mismatches in the size of the various parts of the transistors (i.e., base, connector and emitter) of 10% or more are common in many types of differential amplifiers. These mismatches may result in a significant increase in even-order non-linearity, which usually degrades the performance of the system in which the differential amplifier is used. In bipolar differential amplifier applications, mismatches in the size of the emitter area may be the most critical in terms of the generation of even-order intermodulation products, as the area of the emitter determines the current draw of the amplifier.

Presently, two different methods are typically employed to reduce even-order non-linearity in differential amplifiers. Pursuant to the first of these methods, the component mismatches, and hence the even-order non-linearity, is reduced by using relatively large transistors. This method of providing better component matching relies on the fact that the mismatches in the size of the emitters of the transistors forming the differential amplifier are primarily caused by limitations in etching, mask and other semiconductor manufacturing tolerances. As these tolerances are typically independent of the physical size of the device fabricated, by using larger devices the degree of the mismatch, as measured as a percentage, is reduced. Accordingly, by using larger devices, it is possible to reduce the relative size of the mismatch, which, in turn, provides a corresponding reduction in the even-order non-linearity of the device. Unfortunately, however, any increase in the size of the transistor also typically results in a corresponding increase in the parasitic capacitance of the device. These parasitic capacitances can both degrade the radio frequency performance of the device in which the differential amplifier is used and may also increase power requirements. Consequently, the use of larger devices may not be a viable option in applications with relatively large bandwidth requirements or in power limited systems.

The second method for reducing even-order non-linearity in a differential amplifier involves the use of resistive or inductive degeneration. Pursuant to this method, impedance is added between the emitters (or sources) of the differential amplifier, which acts to improve the overall linearity of the device. However, this reduces the gain of the amplifier, and hence to keep the gain at a certain level, it is necessary to increase the bias current, which results in increased power consumption and heat dissipation. Additionally, if resistive degeneration is used, the added resistance makes the device more noisy, which degrades the radio frequency performance of the device, and the use of inductive degeneration increases power dissipation even further. Moreover, with either type of degeneration, there are limits with respect to the degree to which the non-linearity can be reduced. Consequently, degeneration may also not be an acceptable method of reducing even-order non-linearities in certain applications.

SUMMARY OF THE INVENTION

In view of the above limitations associated with existing differential amplifiers, it is an object of the present invention to provide physically small differential amplifiers having reduced even-order non-linearity.

Another object of the present invention to provide methods for electronically balancing an unbalanced differential amplifier.

These and other objects of the present invention are provided by differential amplifiers which include an analog voltage compensation circuit that is coupled to the differential amplifier's differential input. Preferably, this voltage compensation circuit is configured to provide an analog compensation voltage that is approximately equal to the direct current ("DC") offset voltage referred to the amplifier input (a more detailed discussion of this DC offset voltage is provided herein). In this manner, the DC offset voltage component of the differential amplifier's input voltage, which gives rise to the even-order non-linearities, may be mostly or completely eliminated. Accordingly, pursuant to the teachings of the present invention, simple and easy to implement means for balancing an otherwise unbalanced differential amplifier are provided.

In one embodiment of the present invention, the reduced even-order non-linearity differential amplifier comprises a differential amplifier and an analog voltage compensation circuit coupled to the differential amplifier's differential input port. In this embodiment, the analog voltage compensation circuit provides an analog compensation voltage to the differential input port so as to reduce the imbalance in the differential amplifier. In preferred implementations of this embodiment, the analog voltage compensation circuit includes either a voltage source or a current source. The analog voltage compensation circuit may further include a feedback loop that is coupled between the differential amplifier's output and the amplifier's differential input port. If the amplifier is designed to operate on bandpass signals, preferably this feedback loop has a low-pass response. The feedback transfer function circuit providing such a low-pass response could, for example, be a transconductance amplifier or a current amplifier. Moreover, the transistors comprising the unbalanced differential amplifier may include resistive or inductive degeneration.

In another aspect of the present invention, methods for reducing even-order non-linearity in a differential amplifier are provided. Pursuant to these methods, the direct current component of the differential input to the amplifier is set to zero, and then a circuit is used to sense the output of the differential amplifier to determine if any portion of the output is attributable to this input. If so, a differential compensation voltage may then be applied to the amplifier's input to reduce the output of the differential amplifier attributable to this non-differential direct current input.

Thus, pursuant to the teachings of the present invention, it is possible to electronically adjust differential amplifiers such that even-order distortion due to component mismatch may be significantly reduced. As a result, the size of the transistors used in the amplifier may be selected based on desired radio frequency performance requirements, as opposed to being driven in part by concerns relating to the linearity of the device.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Additionally, it will be understood by those of skill in the art that the present invention may be advantageously used in a variety of applications, and thus the present invention should not be construed as limited in any way to the example applications described herein. Like numbers refer to like elements throughout.

Figure 1:
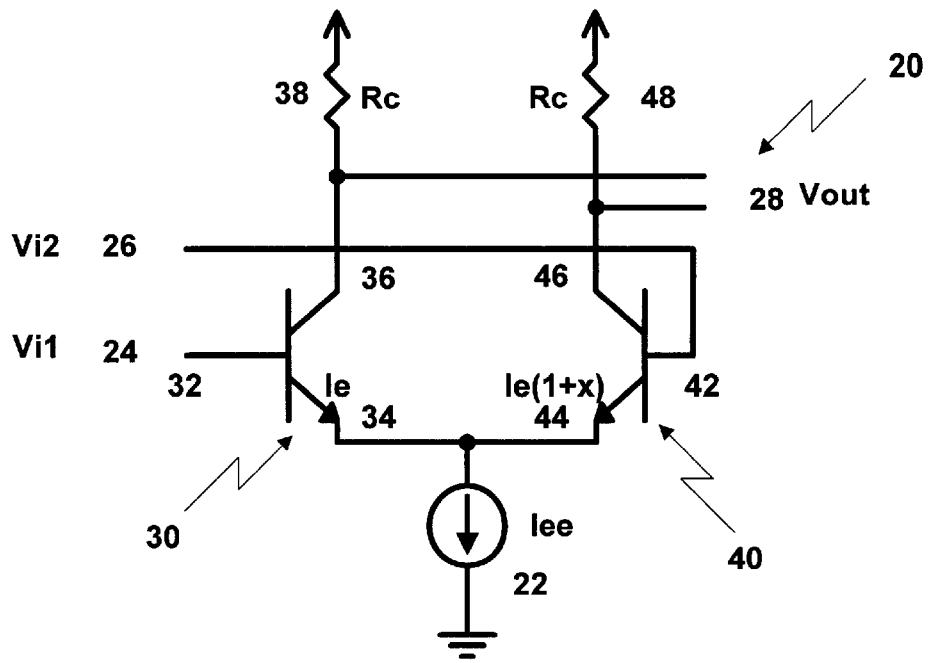
FIG. 1 is a circuit diagram depicting a conventional unbalanced differential amplifier.

FIG. 1 depicts a conventional BJT differential voltage amplifier 20. The amplifier comprises first and second bipolar junction transistors 30, 40 which are coupled at their emitters 34, 44 and biased by a current source 22. The output of the current source 22 is coupled to a reference voltage which, as shown, is typically ground. The differential amplifier 20 further includes a pair of resistors 38, 48 which are coupled to the collectors 36, 46 of the first and second transistors 30, 40, respectively.

In operation, an input signal 24, 26 (which in the case of the amplifier of FIG. 1 would typically be the instantaneous voltage associated with an alternating current signal) may be applied to the bases 32, 42 of the first and second transistors 30, 40. These bases 32, 42 serve as the input terminals (or, collectively, as the "differential input") to differential amplifier 20. As shown in FIG. 1, the output 28 of the amplifier 20 is the voltage measured between the collectors 36, 46 of the first and second transistors 30, 40. As noted above, if the input signals $V_{i1}$, $V_{i2}$ 24, 26 are identical, an ideal differential amplifier will typically have an output 28 of zero. If, however, the input signals $V_{i1}$, $V_{i2}$ 24, 26 are different, the output 28 of differential amplifier 20 is typically configured to be proportional to the difference in the voltage of the two input signals $V_{i1}$, $V_{i2}$ 24, 26.

While FIG. 1 depicts a basic differential voltage amplifier, those of skill in the art will recognize that there are various other types of differential amplifiers, including differential current amplifiers, differential transconductance amplifiers and differential transresistance amplifiers. Moreover, those of skill in the art will also recognize that there are numerous different methods of constructing a differential amplifier, and that these various methods may include additional or different circuit elements than those pictured in the circuit of FIG. 1. By way of example, the differential amplifier of FIG. 1 could be implemented using field effect transistors or any other active device technology instead of the pictured bipolar junction transistors, or could be coupled to cross-coupled switches to form a mixer. Additionally, those of skill in the art will recognize that the differential amplifier may operate on voltage or current input signals, and that the output of the amplifier similarly may be configured to be a current as well as the voltage output 28 depicted in FIG. 1. Accordingly, it will be understood that the present invention may be employed with any differential amplifier, and is not intended to be limited to the amplifiers depicted in the drawings herein.

The present invention may be used to provide differential amplifiers having a relatively high level of balance, regardless of whether or not the transistors used to form the amplifier are well matched. In this regard, note that if the two transistors 30, 40 depicted in FIG. 1 are identical in all respects, then theoretically the emitter currents $I_e$ and $I_e(1+x)$ shown in FIG. 1 will be equal (i.e., x=0) if $V_{i1}=V_{i2}$. In such an amplifier, the differential output voltage $V_{out}$ 28 may be computed as:

$$V_{out}=I_{ee}R_c\tanh((V_{i2}-V_{i1})/2V_T) \quad (2)$$

where $I_{ee}$ is the current source current, $R_c$ is the value (in ohms) of the collector resistors 38, 48, $V_{i1}$ and $V_{i2}$ are the input signals 24, 26 to the amplifier 20, and $V_T$ is the thermal voltage, kT/q, where k is Boltzman's constant, T is absolute temperature, and q is the charge of an electron. Note that in this matched or "balanced" case, $V_{out}$ is an odd function and thus has no even-order non-linearity.

If, however, the emitter areas, and hence the emitter currents $I_e$ and $I_e(1+x)$, are unequal (i.e., x not equal to 1), the balance is upset. In this situation, the differential output voltage may be calculated as:

$$V_{out}=I_{ee}R_c\tanh((V_{i2}-V_{i1}+V_{OS})/2V_T) \quad (3)$$

where $$V_{OS}=V_T\ln(1/(1+x)) \quad (4)$$

This DC offset voltage, $V_{OS}$, in the hyperbolic tangent's argument creates even-order non-linearity in the output 28 of differential amplifier 20.

Pursuant to the teachings of the present invention, it will be realized that the balance of the above-described unbalanced differential amplifier may be restored by providing a differential analog compensation voltage between the two input terminals 32, 42 of the differential amplifier. Specifically, if a voltage equal to $-V_{OS}$ is applied to the differential input to the differential amplifier 20, $V_{out}$ becomes:

$$V_{out}=I_{ee}R_c\tanh((V_{i2}-V_{i1}-V_{OS}+V_{OS})/2V_T)=I_{ee}R_c\tanh((V_{i2}-V_{i1})/2V_T) \quad (5)$$

Figure 2:
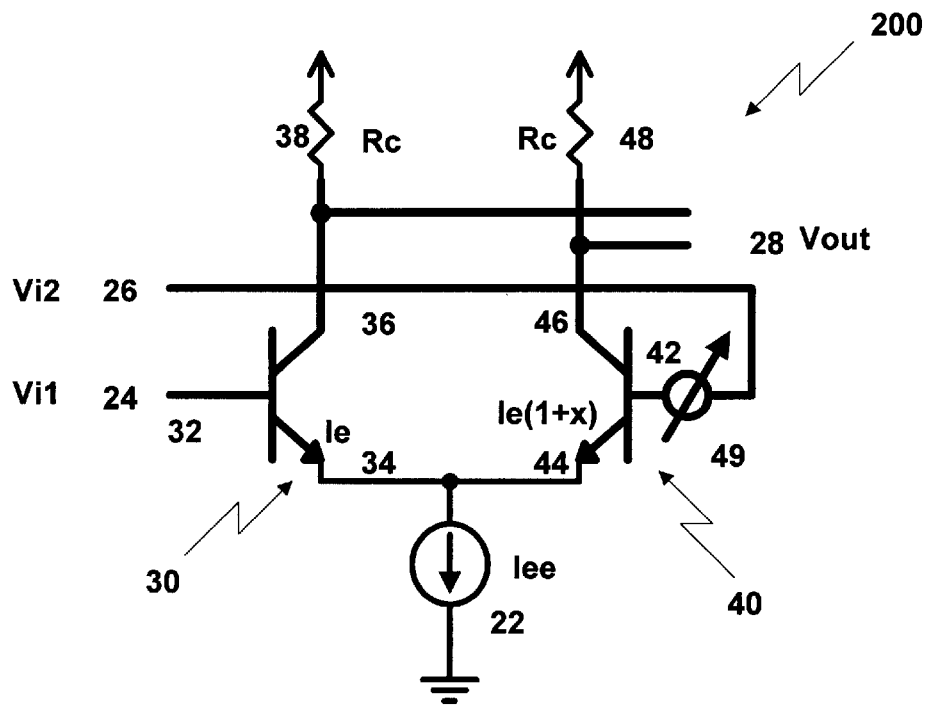
FIG. 2 is a circuit diagram depicting a differential amplifier according to the teachings of the present invention.

Thus, Equation (5) shows that by applying an analog compensation voltage to one of the inputs to an unbalanced differential amplifier, it is possible to restore the balance and thereby suppress the even-order non-linear components in the amplifier's output. FIG. 2 shows how the differential amplifier 20 of FIG. 1 may be modified to include such an analog voltage compensation circuit 49 to provide a balanced differential amplifier 200.

Figure 3:
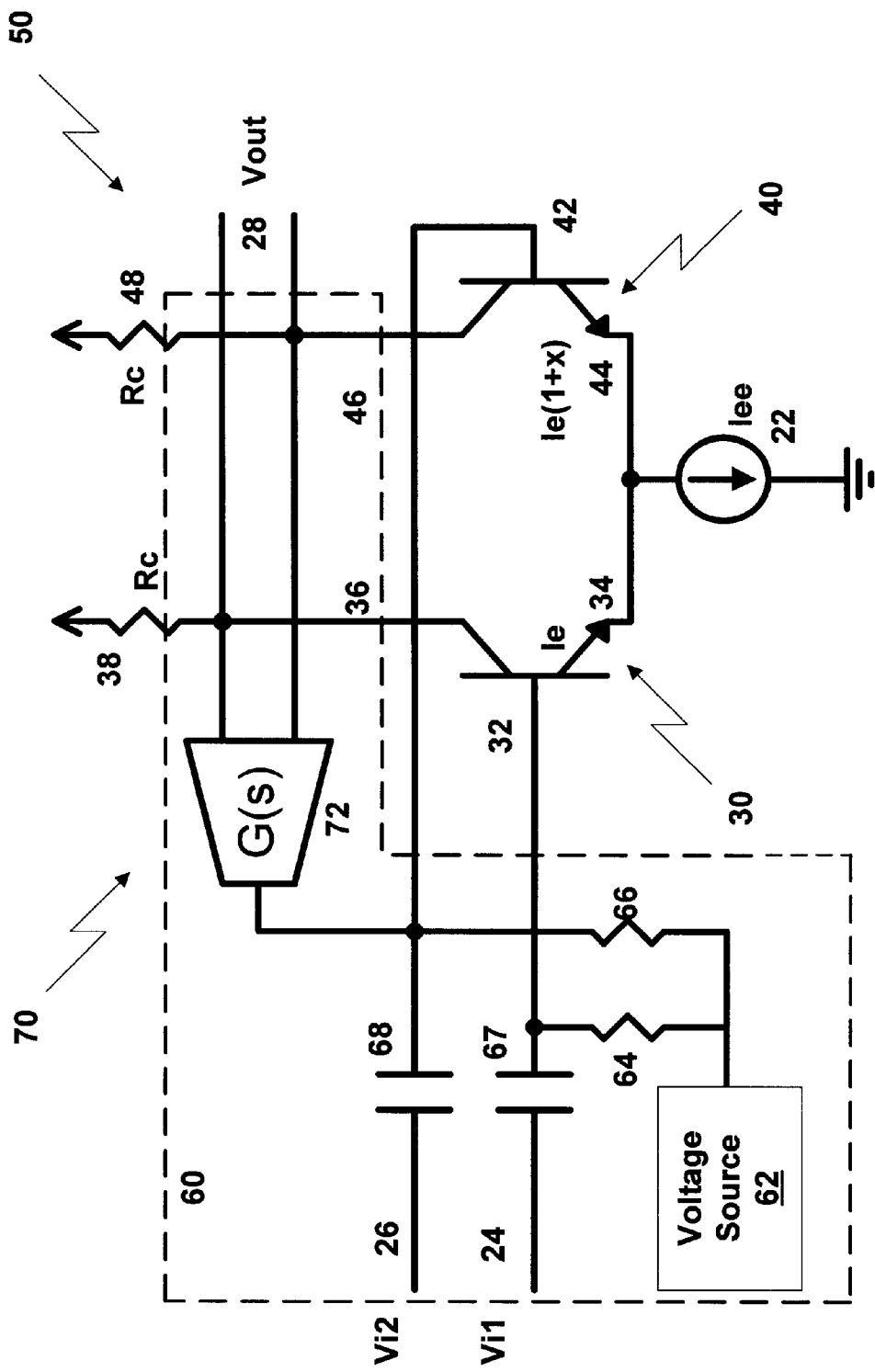
FIG. 3 is a circuit diagram depicting a differential amplifier which includes one embodiment of an analog voltage compensation circuit according to the teachings of the present invention.

FIG. 3 depicts a differential amplifier 50 which includes one possible implementation of the above described analog voltage compensation circuit. In FIG. 3, an unbalanced pair of transistors 30, 40 which are identical to the transistors 30, 40 in the differential amplifier 20 of FIG. 1 are depicted. To this transistor pair an analog voltage compensation circuit, generally depicted as 60, has been added. As shown in FIG. 3, the analog voltage compensation circuit 60 comprises a feedback loop 70 that is coupled between the output 28 of the amplifier 50 and the differential input terminals 32, 42 to amplifier 50. This feedback loop 70 includes a feedback transfer function circuit 72, which has a transfer function labeled G(s). This feedback transfer function circuit 72 senses the output of differential amplifier 50, and provides a feedback single that is proportional to that output. The analog voltage compensation circuit 60 further comprises a direct current voltage source 62 that is coupled across the amplifier's 50 input terminals 32, 42. In this embodiment, the direct current voltage source 62 is preferably connected to the amplifier's input terminals 32, 42 through resistances 64, 66 which are relatively large as compared to the signal path impedance, as this prevents the direct current voltage source 62 from affecting the alternating current signal path. The direct current voltage source 62 establishes the common-mode level at the input of the amplifier 50. Additionally, as is also shown in FIG. 3, DC block capacitors 67, 68 may be included to isolate the direct current voltage source 62 from the input signals 24, 26.

In the circuit of FIG. 3, two alternating current ("AC") input signals 24, 26 may be fed into the input terminals 32, 42 of the amplifier 50. As discussed above, if the transistors 30, 40 are unbalanced, a DC offset voltage will appear in the amplifier's 50 output if amplifier 50 is unbalanced. The feedback loop 70 senses this imbalance and forces it to zero by forcing a current to flow through one of the resistors 64, 66. In this manner, the balance is restored and even-order non-linearities in the output of the amplifier 50 are suppressed. This provides a very simple, efficient and cost-effective way of balancing an unbalanced differential amplifier.

As noted above, in FIG. 3, the feedback loop 70 includes a feedback transfer function circuit 72 which has a transfer function labeled G(s). If the differential amplifier 50 is a voltage amplifier and is designed to operate on bandpass input signals, one convenient method of implementing the feedback transfer function circuit 72 is as a differential transconductance amplifier 75 (not explicitly pictured) having a low-pass frequency response.

The inputs to the transconductance amplifier 75 may be coupled to the differential output 28 of amplifier 50. In this manner, the transconductance amplifier 75 responds to the low-pass component of the output of differential amplifier 50, which, since the input signals to amplifier 50 are bandpass signals, corresponds to the amplifier's offset voltage. As discussed above with respect to Equation (2), if amplifier 50 is balanced, the low pass component of the output of amplifier 50 should be zero (as the input signals are bandpass signals). Thus, as the transconductance amplifier 75 has a low pass response, in this situation the current through the common-mode resistors 64, 66 will be equal. However, as discussed above with respect to Equation (3), if the first and second transistors 30, 40 are unbalanced, the low pass component of the output of the amplifier 50 is not zero. Thus, in this situation, the transconductance amplifier 75 receives a differential input. Since the transconductance amplifier 75 is itself a differential amplifier, it generates an output current in response to this differential input. This current causes relatively more (or less, depending upon whether or not the output of differential amplifier 50 is positive or negative) current to flow through common-mode resistor 66, until the current through the resistor 66 is set such that the low pass component of the response of the amplifier 50 is approximately zero.

As noted above, when the input signals 24, 26 which differential amplifier 50 is designed to amplify, are bandpass signals, typically the feedback transfer function circuit 72 will be designed to have a low-pass response. In this manner, the amplifier will not respond to variations in the input signals 24, 26, but instead will only respond to the DC offset voltage which arises if the transistors 30, 40 comprising differential amplifier 50 are not balanced.

Thus, the offset compensation loop should have no affect on the performance of the amplifier 50 at the signal frequency.

In situations where differential amplifier 50 is designed to operate on signals which are at or near DC (i.e., in low-pass circuits), the response of amplifier 50 to the common mode input ("the common-mode output") must be stored in such a way that the signal path is not affected. One potential way to accomplish this is to store the common-mode output in a digital register that controls a digital to analog converter. In this manner, the analog compensation voltage may be set when no signals are input to differential amplifier 50, thereby balancing amplifier 50 to the extent it was unbalanced. However, when the low-pass input signals are input to differential amplifier 50, the connection between the feedback loop 70 and the output of differential amplifier 50 is disconnected, and in that manner the feedback loop 70 does not respond to or otherwise affect the amplifier's performance when signals are input to amplifier 50.

Those of skill in the art will appreciate that numerous different circuits may be used to implement feedback transfer function circuit 72 in the feedback compensation loop 70. For instance, the feedback transfer function circuit 72 could be designed to sample the output of differential amplifier 50 at discrete elements as opposed to providing continuous feedback. In another implementation, feedback transfer function circuit 72 could be implemented as a current amplifier, which is a useful implementation if the differential amplifier it is used to balance is a current, as opposed to voltage, amplifier. Thus, in light of the present disclosure, those of skill in the art will understand that feedback transfer function circuit 72 may be any suitable circuit which senses any offset output of differential amplifier 50, and if such an offset output is present, facilitates adjustment of the input to one or both of the transistors 30, 40 comprising differential amplifier 50 so as to drive the DC component of the output of amplifier 50 towards zero. Additionally, it will be understood that feedback transfer function circuit 72 should be designed so that it has little or no impact on the performance of differential amplifier 50 at the signal frequency.

While the above description has primarily described the present invention in terms of applying an analog compensation voltage to the input of an unmatched differential amplifier as a means of balancing the amplifier, those of skill in the art will appreciate that either a voltage source or a current source may be used to restore the balance. What is important is that a differential voltage is provided across the inputs of the differential amplifier so as to compensate for any mismatch. Thus, it will be understood that as used herein the term "analog voltage compensation circuit" is intended to refer to any circuit that may be used to provide a differential compensation voltage across the inputs of a differential amplifier, whether that circuit include a voltage source, a current source or a combination thereof.

In another embodiment of the present invention, the differential amplifier may further include resistive or inductive degeneration, in addition to the compensation feedback loop 70, as further means for reducing the even-order non-linearity. This embodiment may be preferred in applications such as the amplifiers at the front end of certain radio receivers (e.g., the amplifier in the downconverter block) where very stringent linearity requirements are imposed. The degeneration further improves the linearity of the differential amplifier, and, as discussed in the example below, it has been shown through simulation that the use of degeneration does not negatively impact the ability of the compensation feedback loop to work to restore the mismatch between the circuit elements comprising the differential amplifier.

Figure 4:
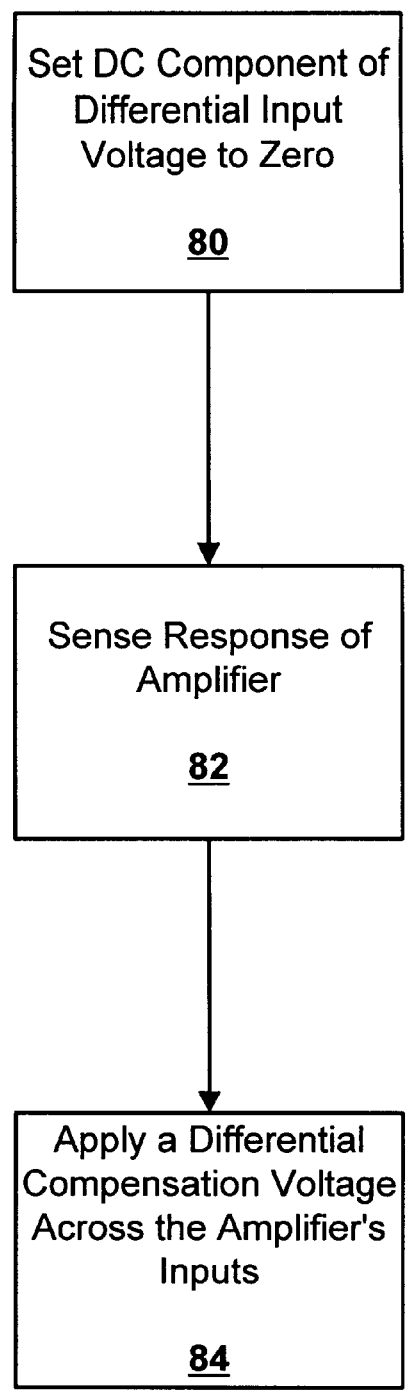
FIG. 4 is a flow chart depicting a method for balancing a differential amplifier according to the teachings of the present invention.

FIG. 4 is a flow chart which illustrates operations for balancing a differential amplifier pursuant to the teachings of the present invention. As shown in FIG. 4 at block 80, the direct current component of the input to differential amplifier 20 is set to zero. As discussed above, if the differential amplifier 20 is unbalanced, the response of amplifier 20 will, in the argument of the hyperbolic tangent, include a DC offset voltage (see Equation (3) above). As indicated in FIG. 4, such a response of amplifier 20 may be sensed (block 82). This may be accomplished by, for example, coupling the inputs of a low-pass transconductance amplifier to the differential output of differential amplifier 20. Finally, as shown in block 84 of FIG. 4, a differential compensation voltage may be applied to the inputs of differential amplifier 20. As a result of this differential input voltage, one of the transistors 30, 40 comprising the differential pair is driven to a greater extent than the other transistor 30, 40 comprising the pair, in a manner which effectively reduces the imbalance between the two transistors. In a preferred embodiment of the methods of the present invention, the steps 80, 82, 84 depicted in FIG. 4 are repeated until the response of differential amplifier 20 to the direct current component of the input signal is driven to zero.

EXAMPLE

Figure 5:
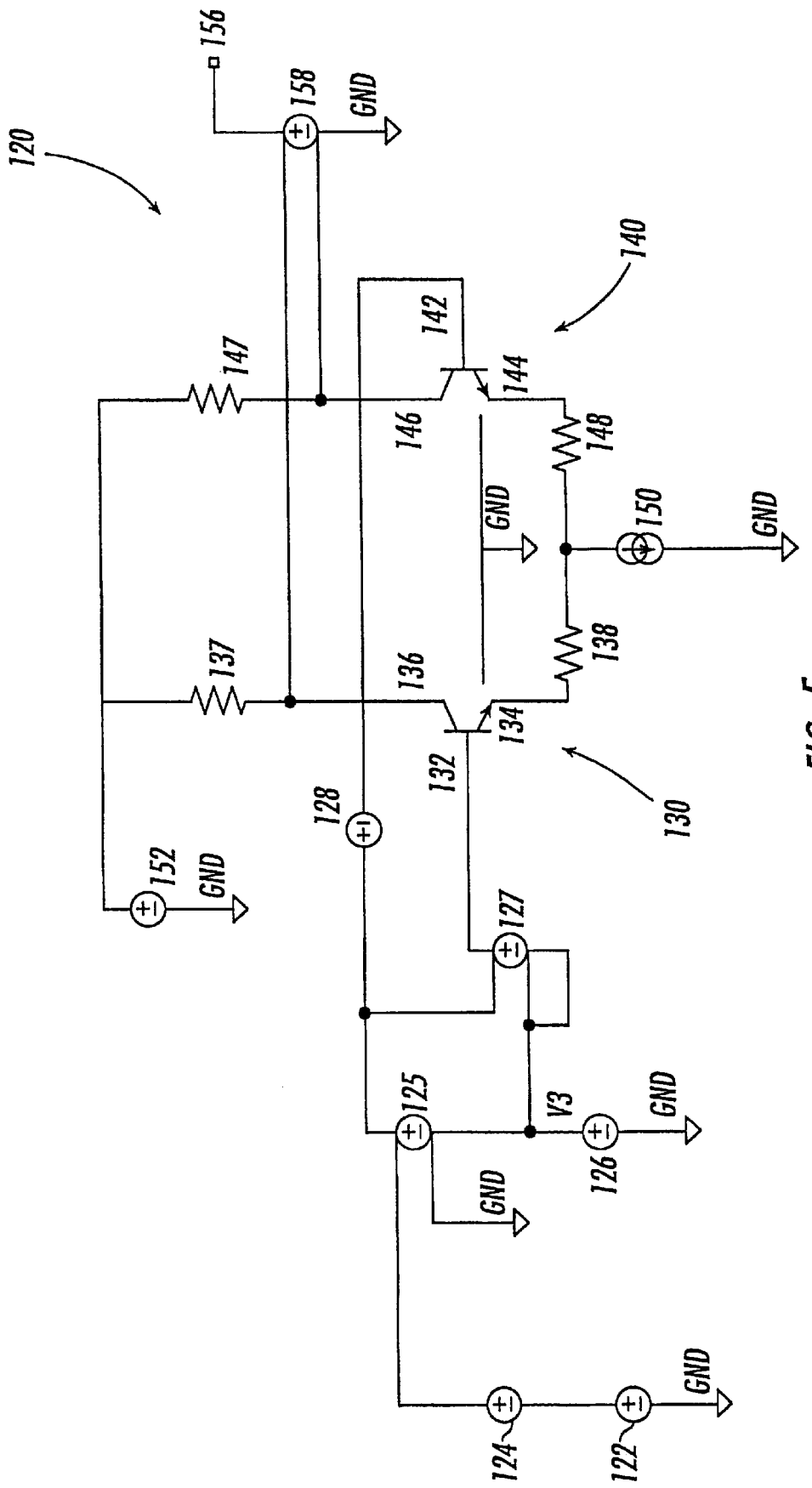
FIG. 5 is a circuit diagram of the circuit simulated in the example described herein.

A simulation has been performed in which two 50 mV input signals were input into a differential amplifier according to the present invention and a transient analysis was performed. FIG. 5 is a circuit diagram of the circuit used in the simulation. In this simulation, a differential amplifier 120 was driven by the two 50 mV alternating current input signals 122, 124. Differential amplifier 120 comprises first and second transistors 130, 140 having bases 132, 142, emitters, 134, 144 and collectors 136, 146, respectively. The transistors 130, 140 depicted in FIG. 5 were modeled to include frequency dependent effects such as parasitic capacitances. The resistors 138, 148 provide degeneration. In the circuit of FIG. 5, the transistors 130, 140 were modeled as being balanced except that the area of the emitter of the first transistor 130 was modeled as being 1.1 times the area of the emitter of the second transistor 140 (a degree of mismatch which is not unusual in radiofrequency optimized technologies).

In FIG. 5, the first and second 50 mV input signals 122, 124 are at 600 MHz and 1800 MHz, respectively. A direct current voltage source 126 was also provided, which was set at 1.5 Volts. Circuit elements 125 and 127 shown in FIG. 5 serve to convert the single-ended direct current voltage source 126 into a balanced voltage that is applied across each of the inputs 132, 142 to differential amplifier 120. An analog voltage compensation circuit is also provided, which was modeled as an analog compensation voltage 128 that is applied to input 142 of transistor 140.

As is also shown in FIG. 5, amplifier 120 is biased by a (3 milliamp) current source 150. The emitters 134, 144 of each transistor are also coupled to a (20 ohm) resistors 138, 148 which serve to provide resistive degeneration. The collectors 136, 146 of the first and second transistors 130, 140 are biased by voltage source 152, which is connected to the collectors 136, 146 through (200 ohm) resistors 137, 147. The output 156 to differential amplifier 120 is measured across the collectors 136, 146, and is converted to a single ended voltage by converter 158.

Figure 6:
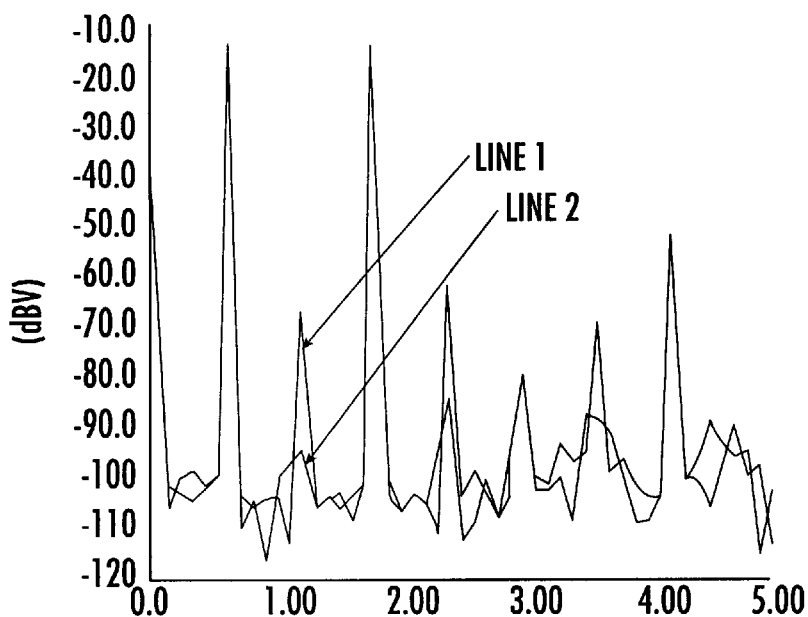
FIG. 6 is the simulated output spectra of the circuit of FIG. 5 in response to the inputs described in the example herein.

FIG. 6 depicts the simulated spectra of the circuit of FIG. 5 for a transient analysis where the two above described 50 mV input signals are fed into the circuit. In FIG. 6, line 1 denotes the simulated spectra when the analog compensation voltage is set to zero, and line 2 denotes the simulated spectra when the analog compensation voltage is set to its ideal value of 3.11 mV (see FIG. 7 and its associated discussion herein). As shown in FIG. 6, the second order IM product at 1200 MHz is reduced by 32 dB if compensation is used. FIG. 6 also indicates that the second order products at 2400 MHz and 3600 MHz are reduced by approximately 24 dB and 22 dB, respectively. This suggests that the compensation provided by the present invention provides a significant reduction in evenorder non-linearity even at high frequencies.

Figure 7:
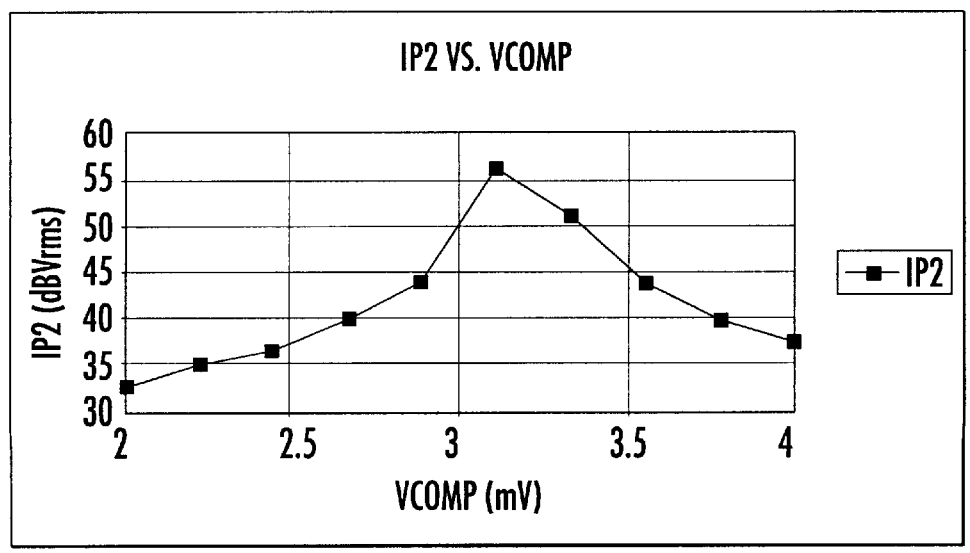
FIG. 7 is a graph depicting the simulated magnitude of the second order IM products versus the compensation voltage in the example described herein.

FIG. 7 shows the simulated second order intermodulation intercept point ("IP2") graphed as a function of the compensation voltage level. Although not shown in FIG. 7, the level of IP2 with no compensation is 24 dBVrms. The graph shows that the maximum reduction in IP2 is obtained for a compensation voltage of approximately 3.11 mV. Thus, a compensation voltage of approximately 3.11 mV appears to be the optimum compensation voltage level in terms of reducing even-order non-linearities for the circuit of FIG. 5. Note, however, that even with a +10% error in this compensation voltage, IP2 is reduced by at least 20 dB.

In the drawings, specification and examples, there have been disclosed typical preferred embodiments of the invention and, although specific terms are employed, these terms are used in a generic and descriptive sense only and not for purposes of limitation, the scope of the invention being set forth in the following claims. Accordingly, those of skill in the art will themselves be able to conceive of embodiments of synchronization methods other than those explicitly described herein without going beyond the scope of the present invention.

That which is claimed is:

1. A bandpass differential amplifier having reduced even-order non-linearity comprising:
   a differential amplifier having a first input port coupled to a first bandpass signal source and a second input port coupled to a second bandpass signal source and a differential output; and
   an analog voltage compensation circuit comprising a feedback loop having a low-pass response coupled between said differential output and both said first input port and said second input port and a direct current voltage source coupled to said first input port and to said second input port.

2. The differential amplifier of claim 1, wherein said analog voltage compensation circuit is only responsive to differences in current flow through said differential amplifier resulting from component mismatches.

3. The differential amplifier of claim 2, wherein said direct current voltage source comprises a common mode reference voltage.

4. The differential amplifier of claim 2, further comprising a first resistance coupled between said direct current voltage source and said first input port and a second resistance coupled between said direct current voltage source and said second input port.

5. The differential amplifier of claim 4, further comprising a first capacitance coupled between said first bandpass signal source and said direct current voltage source and a second capacitance coupled between said second bandpass signal source and said direct current voltage source.

6. The differential amplifier of claim 2, wherein said feedback loop comprises a transconductance amplifier.

7. A differential amplifier having reduced even-order non-linearity comprising:
   a differential amplifier having a differential input port and a differential output; and
   an analog voltage compensation circuit comprising a voltage source coupled to said differential input port and a feedback loop having a low-pass response coupled between said differential output and said differential input port, wherein the analog voltage compensation circuit provides an analog compensation voltage to the differential input port so as to reduce the imbalance in the differential amplifier;
   wherein said feedback loop comprises a current amplifier coupled between said different output and said differential input port.

8. The differential amplifier of claim 1, wherein said differential amplifier comprises a first transistor having a controlling terminal and first and second controlled terminals, a second transistor having a controlling terminal and first and second controlled terminals, and a current source; and
   wherein said first input port is coupled to the controlling terminal on said first transistor and said second input port is coupled to the controlling terminal on said second transistor;
   wherein said differential output comprises the voltage measured between the first controlled terminal on said first transistor and the first controlled terminal on said second transistor;
   wherein the second controlled terminals on said first and second transistors are coupled together and biased by said current source; and
   further comprising an impedance coupled between said current source and the second controlled terminals on said first and second transistors.

9. The differential amplifier of claim 8, wherein said impedance comprises a first resistor coupled between the second controlled terminal on said first transistor and said current source and a second resistor coupled between the second controlled terminal on said second transistor and said current source.

10. The differential amplifier of claim 1, in combination with a radiotelephone having a transmitter, a receiver, and a user interface, and wherein said differential amplifier comprises an amplifier in the downconverter block of said receiver.

11. The differential amplifier of claim 7, wherein said differential input port comprises a first input port and a second input port, and further comprising a first resistance coupled between said voltage source and said first input port and a second resistance coupled between said voltage source and said second input port.

12. The differential amplifier of claim 7, wherein said voltage source comprises a common mode reference voltage.

13. The differential amplifier of claim 7, wherein said feedback loop has a low-pass response and further comprising a first capacitance coupled between a first bandpass signal source and said voltage source and a second capacitance coupled between a second bandpass signal source and said voltage source.

14. A method for reducing even-order non-linearity in a bandpass differential amplifier having first and second input ports and a differential output, the method comprising the steps of:

applying a first bandpass signal to the first input port;

applying a second bandpass signal to the second input port;

applying a common mode reference voltage to the first and second input ports;

sensing the response of the differential amplifier to the common mode reference voltage; and applying a differential compensation voltage across the first and second input ports to decrease any imbalance in the differential amplifier.

15. The method of claim 14, wherein the differential amplifier further comprises a lowpass feedback loop coupled between the differential output and the first input port, and wherein said applying a differential compensation voltage step comprises the step of adjusting the relative voltage applied to the first and second input ports based on an output of the feedback loop.

16. The method of claim 15, wherein said common mode reference voltage is coupled to the first and second input ports through first and second resistances, and wherein said applying a differential compensation voltage step further comprises forcing differential currents through said first and second resistances so as to provide a differential direct current compensation voltage across said first and second input ports.

17. The method of claim 15, wherein said feedback loop comprises a transconductance amplifier coupled between the differential output and the first input port.

18. The method of claim 15, wherein the lowpass feedback loop senses the output of the differential amplifier attributable to the common mode reference voltage and wherein said applying a differential compensation voltage step is repeated so long as the output of the differential amplifier attributable to the common mode reference voltage is greater than zero.

19. A system for reducing even-order non-linearity in an unbalanced bandpass differential amplifier having first and second input ports and a differential output comprising:

means for applying a first bandpass signal to the first input port;

means for applying a second bandpass signal to the second input port;

means for applying a common mode reference voltage to the first and second input ports;

means for sensing the response of the differential amplifier to the common mode reference voltage; and means for applying a differential compensation voltage across the first and second input ports to decrease any imbalance in the differential amplifier.

20. The system of claim 19, wherein said means for applying a differential compensation voltage comprises a lowpass feedback loop coupled between the differential output and the first input port.

21. The system of claim 20, further comprising a common mode reference voltage which is coupled to the first and second input ports of said differential amplifier through first and second resistances.

22. The system of claim 20, wherein said feedback loop comprises a transconductance amplifier coupled between the differential output and the first input port.

23. The method of claim 15, wherein said feedback loop comprises a current amplifier coupled between the differential output and the first input port.

* * * * *